United States Patent [19]
Okami et al.

[11] Patent Number: 6,074,963
[45] Date of Patent: *Jun. 13, 2000

[54] THERMALLY CONDUCTIVE COMPOSITE SHEETS AND MANUFACTURING METHOD THEREOF

[75] Inventors: Takehide Okami; Tokio Sekiya; Takeshi Hashimoto, all of Matsuidamachi, Japan

[73] Assignee: Shin-Etsu Chemical, Co., Ltd., Japan

[ * ] Notice: This patent is subject to a terminal disclaimer.

[21] Appl. No.: 08/688,197

[22] Filed: Jul. 29, 1996

Related U.S. Application Data

[63] Continuation of application No. 08/413,468, Mar. 28, 1995, abandoned.

[30] Foreign Application Priority Data

Mar. 29, 1994 [JP] Japan ................................ 6-082450

[51] Int. Cl.[7] ......................................... B32B 5/10
[52] U.S. Cl. .................. 442/16; 442/19; 442/20; 442/27; 442/29; 442/37; 442/58
[58] Field of Search ................... 442/16, 19, 20, 442/27, 29, 37, 58

[56] References Cited

U.S. PATENT DOCUMENTS

| | | | |
|---|---|---|---|
| 4,842,911 | 6/1989 | Fick | 428/40 |
| 5,160,681 | 11/1992 | Shimizu | |
| 5,705,258 | 1/1998 | Okami et al. | 428/202 |

FOREIGN PATENT DOCUMENTS

| | | |
|---|---|---|
| 05271548 | 1/1994 | Japan . |
| 06107950 | 7/1994 | Japan . |

*Primary Examiner*—Elizabeth M. Cole
*Attorney, Agent, or Firm*—Millen, White, Zelano & Branigan, P.C.

[57] ABSTRACT

Thermally conductive composite sheets which comprise a silicone rubber layer which contains thermally conductive fillers and has an Asker C hardness from 5 to 50, and a porous reinforcing material layer which has pores of at least 0.3 mm in diameter and is incorporated within the silicone rubber layer. The thermally conductive composite sheets of the present invention are superior in thermal conductivity and flexibility (for contact towards the electronic parts and so on) and are suitable for mass production and for the assembly process of electronic instruments. Therefore, utilization of the thermally conductive composite sheets enables the effective production of electronic instruments wherein performance degradation caused by heat hardly occurs.

11 Claims, No Drawings

6,074,963

THERMALLY CONDUCTIVE COMPOSITE SHEETS AND MANUFACTURING METHOD THEREOF

This application is a continuation of application Ser. No. 08/413,468, filed Mar. 28, 1995, now abandoned.

This invention relates to thermally conductive composite sheets which are suitable for providing heat radiation from pyrogenic electronic parts and a method for manufacturing the composite sheets.

BACKGROUND OF THE INVENTION

The generation of heat causes degradation of characteristics in pyrogenic parts of electronic instruments, such as power transistors and thyristors, and integrated circuit elements, such as IC and LSI. Therefore, it is necessary to provide some means within the electronic instruments to smoothly radiate heat.

The advancements in high density integration of electronic instruments, such as computers and word processors, have increased the amount of heat generated in pyrogenic parts, such as power transistors and thyristors, and in integrated circuit elements, such as IC and LSI, within these instruments. Therefore, a conventional forced air cooling system utilizing cooling fans no longer provides sufficient cooling. Particularly, in the case of portable personal computers of the lap-top type and notebook type, a cooling method besides the forced air cooling type becomes necessary. Further, these particular electronic instruments have the integrated circuit elements attached to a printed substrate board, the materials for which are often glass reinforced epoxy resins and polyimide resins with inferior thermal conductivity. As a result, these instruments cannot release the heat from the substrate board through a radiative insulating sheet, as commonly performed in conventional models. Therefore, the conventional heat radiation method employs radiators of a spontaneous cooling type or a forced cooling type which are placed in the vicinity of the integrated circuit elements and the heat generated from the elements is conducted to and is radiated from these radiators. In this method, a radiative insulting sheet is placed between the pyrogenic elements and the radiators for better heat conductivity. However, the conventional radiative insulating sheets are inferior in their flexibility, which may cause the problem of damage to the adjacent elements and to the substrate board due to the excess stress developed during thermal expansion. Therefore, a radiative insulating sheet with improved flexibility is in demand.

Further, when the heat radiation is carried out by the attached radiators, attachment of radiators for each integrated circuit will require extra space, which makes building the compact instrument difficult. Therefore, the current type combines several pyrogenic elements with one radiator. In this case, each element has a different height, thus the sizes and the shapes of gaps between the elements and the radiators are widely varied. A radiative insulating sheet which corresponds to this problem is also in demand. Some thermally conductive materials which offer a superior thermal conductivity, a good flexibility, and a capability to correspond to a variety in shapes and sizes of gap, have been proposed.

Japanese Patent Application Kokai (laid open) 2-166755 discloses a method which employs a sheet formed from a mixture of silicone resin gels and thermally conductive materials such a metal oxides, wherein grooves are placed on one side or both sides of the sheet. Such grooves are intended to increase the variability in amount, leading to an increase in the contact surface area. However, this sheet is so soft that its handling is difficult after forming, and mass production is also difficult. Further, there are also disadvantages such as insufficient strength and a time-consuming assembly process.

Japanese Patent Application Kokai 2-196453 discloses a sheet which comprises a silicone resin layer formed from mixture of silicone resins and thermally conductive materials, such as metal oxides, having enough strength for handling, and a soft flexible silicone resin layer, being laid on the resin layer. This sheet is easier in handling, however, its forming method is difficult and it is not suitable for mass production. The silicone resin layer possesses a certain strength and when it is formed together with a softer silicone resin layer, it will be deformed by the stress occurring during the forming process. As a result, this sheet is not suitable for the common forming methods, such as automatic injection forming and continuous coating forming processes, which results in low productivity and a high cost.

A radiative insulating sheet reinforced by cloth-type reinforcing materials, such as a glass cloth, is also known (Japanese Patent Application Kokai 56-161140). This sheet is produced by laminating two silicone rubber sheets, containing silane-treated inorganic fillers, on both sides of a silane-treated glass cloth. Therefore, its productivity is low and the two thermally conductive silicone rubber sheets at the top and the bottom are not in contact, which impairs the thermally conductivity.

SUMMARY OF THE INVENTION

Therefore, an object of the present invention is to provide thermally conductive composite sheets with superior thermally conductivity and flexibility, along with suitability both in mass production and in the electronic instrument assembly process, and a manufacturing method for said sheets.

Upon further study of the specification and appended claims, further objects and advantages of this invention will become apparent to those skilled in the art.

The present invention is directed to thermally conductive composite sheets which comprise a silicone rubber layer which contains thermally conductive fillers and has an Asker C hardness from 5 to 50, and a porous reinforcing material layer, which has pores of at least 0.3 mm in diameter, incorporated within the silicone rubber layer. Further, the present invention is directed to a manufacturing method for said thermally conductive composite sheets, wherein the porous reinforcing material layer is placed on, under, or within a liquid addition curing type organopolysiloxane composition layer which contains thermally conductive fillers and will provide an Asker C hardness from 5 to 50 after curing, followed by the press-forming of said siloxane composition layer and said porous reinforcing material layer by applying pressure from the top and bottom under a heated condition, thus curing the organopolysiloxane composition.

Thermally Conductive Composite Sheets

The thermally conductive composite sheets of the present invention comprise a silicone rubber layer which contains thermally conductive fillers and has an Asker C hardness from 5 to 50, and a porous reinforcing material layer.

Silicone Rubber Layer

A method for cross-linking of the silicone rubber layer may be of the addition-type, the condensation-type, the organic peroxide-type, among others, and is not limited to specifics, as long as it contains thermally conductive fillers and its hardness is from 5 to 50 by the Asker C hardness scale. Based on its workability and quality stability, the liquid type silicone rubber composition, particularly the silicone rubber cured from the liquid addition curing type organopolysiloxane compositions, is desirable. Examples of the thermally conductive fillers are those used in known thermally conductive resin compounds, such as aluminum oxide, boron nitride, aluminum nitride, zinc oxide, silicon carbide, quartz, and aluminum hydroxide. The amount of these thermally conductive fillers are preferably 25 to 90 weight %, more preferably 50 to 85 weight %, based on the total silicone rubber weight. A lesser amount of fillers leads to insufficient thermal conductivity in the thermally conductive composite sheets and an excess amount impairs the flexibility of the thermally conductive composite sheets.

It is necessary for the hardness of the silicone rubber layer to be from 5 to 50, more preferably from 10 to 35, on the Asker C hardness scale. Here the Asker C hardness is the hardness measured by a spring type hardness test device, the Asker C model, based on SRIS 0101 (Standards of Japanese Rubber Industry Society) and JIS S 6050. When the hardness of the silicone rubber layer is less than 5 on the Asker C scale, it is too soft to maintain its shape, to reinforce sufficiently and to offer a good productivity. On the other hand, a hardness of over 50 is too hard to make a good contact with part, which impairs the fit of the sheet to the shapes of the pyrogenic elements and makes the release of heat difficult.

Porous Reinforcing Material Layer

The porous reinforcing material layer provides reinforcement to the silicone rubber layer. In addition, it suppresses the ductility of the thermally conductive composite sheets of the present invention in the surface direction, e.g., along the plane of the layer when flat. Such reinforcing material layer must possess enough strength to provide a sufficient reinforcing effect and pores of at least 0.3 mm in diameter. Here, the pore diameter indicates the diameter of a pore when it is almost circular, otherwise the shortest diameter of the pore. For example, it means the shorter diameter for an ellipse, a side length for a square, and the length of a short side for a rectangle. The size of the pore is desirably from 0.3 to 10 mm, more preferably from 1 to 5 mm, in diameter. In addition, the air gap ratio caused by the pores is desirably from 20 to 95%, from the viewpoints of reinforcing effects and thermal conductivity in the up-and-down direction of the reinforcing layers. For instance, the material may provide a surface which has 20% to 95% of its surface open as pores fully through the layer, e.g., in a netted form. Further, the thickness of the reinforcing layer is desirably 0.1 to 1.0 mm, more preferably from 0.2 to 0.5 mm. If the air gap ratio is large, the reinforcing effect is reduced and if it is small, the thermally conductivity is reduced.

Examples of the porous reinforcing material layer are: glass cloth, mesh cloth made of polyesters, heat resistant nylons, and cottons; porous resin films and netted films made of polyimide resins, heat resistance nylons; and acrylic resins. Among them, glass cloth with a superior heat conductivity is preferred. Further, mesh cloths with large size pores are suitable for mass production, thus for lowering the cost. Further, among the mesh cloths, the polyester mesh cloth and the heat resistant nylon mesh cloth are desirable. A twine woven type mesh cloth is particularly preferred.

The position of the porous reinforcing material layer in the thermally conductive composite sheet of the present invention is not limited to specifics, as long as the porous reinforcing material layer is incorporated within the silicone rubber layer. It is, however, preferable for the porous reinforcing material layer to be located in the middle of the silicone rubber layer or close thereto. Further, there may be single porous or multiple porous reinforcing material layers. When the porous reinforcing material layer is on the surface of the silicone rubber sheet, the surface becomes uneven, which impairs its contact with the electronic parts.

Manufacturing Method of Thermally Conductive Composite Sheets

The thermally conductive composite sheets of the present invention are manufactured, for example, by a process wherein the porous reinforcing material layer is placed in at least one position of, on, under, or within a liquid addition curing type organopolysiloxane composition layer which contains thermally conductive fillers and will provide an Asker C hardness from 5 to 50 after curing, followed by the press-forming of the organopolysiloxane composition layer and the porous reinforcing material layer by applying pressure from the top and bottom under a heated condition.

In general, a preferred embodiment is to spread the liquid composition on a board with a desired surface area, followed by the porous reinforcing material layer on top, and then to press-form, by applying pressure from the top and bottom. The liquid composition quickly penetrates through the pores of the porous reinforcing material layer to the top, therefore, the obtained cured sheet incorporates the porous reinforcing layer within the cured silicone rubber layer.

Liquid Addition Curing Type Organopolysiloxane Compositions

The liquid addition curing type organopolysiloxane compositions have conventionally been utilized for the production of thermally conductive silicone rubbers and they are not limited to specifics as long as they possess thermally conductive fillers and the hardness of the cured product is from 5 to 50 in the Asker C hardness scale. Examples of the compositions are compositions having the following components (A) through (D):

(A) organopolysiloxanes having at least two alkenyl groups within the molecule;

(B) organohydrogen polysiloxanes having at least two hydrogen atoms bound to silicon atoms within the molecule;

(C) platinum group metallic catalyst; and (D) thermally conductive fillers.

(A) Component

The component (A) must possess at least two alkenyl groups within the molecule and it may be expressed by, for example, the average composition formula (I) below:

$$R_a SiO_{(4-a)/2} \qquad (1)$$

wherein R is a substituted or unsubstituted monovalent hydrocarbon group and a is a number from 1.85 to 2.15. Alkenyl groups become the crosslinking points for curing, therefore, this composition will essentially not cure without molecules having at least two alkenyl groups per molecule. It may also contain organopolysiloxanes having one alkenyl group per molecule with one alkenyl group at one end, or organopolysiloxanes without alkenyl groups, as far as the total composition of the organopolysiloxanes possess at least 0.5 alkenyl groups on the average per molecule. The desirable amount of alkenyl groups in the component (A) is from 0.01 to 15 mol %, more desirably from 0.02 to 5 mol %. In general formula (1), examples of a substituted or unsubstituted monovalent hydrocarbon group, R, are: alkyl groups such as a methyl group, an ethyl group, and a propyl group; cycloalkyl groups such as a cyclopentyl group and a cyclohexyl group; alkenyl groups such as a vinyl group and an allyl group; aryl groups such as a phenyl group and a tolyl group; and said groups in which hydrogen atoms are partially substituted by chlorine atoms and fluorine atoms, e.g., the halogenated hydrocarbon groups, such as a trifluoropropyl group. A vinyl group is particularly desirable as an alkenyl group. Further, desirable R groups besides alkenyl groups are methyl groups, phenyl groups, and trifluoropropyl groups.

The viscosity of the component (A) is desirably at most 100,000 cSt, more preferably from 500 to 30,000 cSt, at 25° C. Excessively high viscosity impairs the fluidity of the organopolysiloxane composition prior to curing, which hinders the working efficiency.

(B) Component

The component (B) comprises linear, branched or cyclic molecules having at least two hydrogen atoms bound to silicon atoms per molecule. The component (B) reacts with the component (A) as a crosslinking agent. The amount of the component (B) is usually an amount sufficient to provide 0.1 to 1.5, more desirably 0.2 to 1.2, hydrogen atoms bound to silicon atoms per one alkenyl group contained in the component (A). Lesser amounts result in a lower crosslinking density, which leads to insufficient strength and heat resistance in the obtained cured product. On the other hand, excess amounts cause a problem of vigorous foaming by dehydrogenation and insufficient flexibility of the obtained cured product.

(C) Component

Examples of the component (C) are: platinum black, chloroplatinic acid, alcohol denatured chloroplatinic acid, and complexes of chloroplatinic acid with olefins, vinyl siloxanes, and acetylene alcohols. The amount of the component (C) may be selected appropriately, according to the desired curing rate. In general, the amount added is 0.1 to 500 ppm, more desirably 1 to 200 ppm, of platinum group metal equivalent based on the component (A).

(D) Component

Examples of the component (D) are the thermal conductive fillers described above. The amount of component (D) is usually 25 to 90 weight %, more desirably 50 to 85 weight %, based on the total weight of the organopolysiloxane composition. Lesser amounts will lead to insufficient thermally conductivity, while excess amounts hinder the fluidity of the composition, causing the lower working efficiency and a harder cured product with lower flexibility of the silicone rubber.

Other Additives

Additives which may be added to the composition as necessary in order to control, for example, the curing rate and stability during storage of the composition are: organopolysiloxanes having vinyl groups such as methyl vinyl cyclotetrasiloxane; triallyl isocyanurate, acetylene alcohol, and their products denatured by siloxane. Further, adhesives, reinforcing silica, coloring agents, heat resistance enhancers, and adhesivity promoters may be added to the composition, as long as the effect of the present invention is not impaired.

Press Forming

Conditions for the press forming are the usual conditions utilized for the curing and forming of curable organopolysiloxane compositions by press forming and are not limited to any specifics. Among the forming conditions, the temperature is preferably from 50° C. to 200° C., more preferably from 60° C. to 180° C. Further, the pressure may be selected appropriately according to the viscosity of the composition. For the forming of the compositions with good fluidity, pressurization may not be necessary. However, it is usually preferred to pressurize at 5 to 50 kgf/cm$^2$ in order to avoid the inclusion of bubbles. Further, the conditions must be sufficient to adequately cure the organopolysiloxane composition.

The press forming is performed, for example, by the following process. The liquid addition curable type organopolysiloxane composition is placed on a heated board, then the porous reinforcing material is placed on top. The composition and the porous reinforcing material are surrounded by a frame and a board similar to that described above is further placed on the composite material comprising the liquid addition curable type organopolysiloxane composition and the porous reinforcing material. This laminated product comprising boards, the liquid addition curable type organopolysiloxane composition, and the porous reinforcing material, is press-formed to obtain the thermally conductive composition sheet.

The said board and frame materials desirably possess a good mold releasing property against the liquid addition curable type organopolysiloxane composition. Such materials with a good mold releasing property are, for example, fluorine resin coated boards, teflon films, and polyethylene terephthalate (PET) films coated with fluorine type mold releasing agents.

Effects

The thermally conductive composite sheets of the present invention are useful as a heat radiative insulating sheet utilized between pyrogenic electronic parts and radiators within electronic instruments.

In the thermally conductive composite sheet of the present invention there is a connection of the thermally conductive silicone rubber material above and below the porous reinforcing material layer through the pores of the porous reinforcing material layer. For example, the press forming step presses the organopolysiloxane composition through at least some of the pores of the porous material wherein it is cured to provide a continuous phase of silicone rubber material through the porous material. Therefore, the thermally conductivity of the sheet in the vertical direction, i.e., perpendicular to the plane, is hardly hindered by the porous reinforcing material layer. Further, the existence of silicone rubber material on both sides of the porous reinforcing material layer allows the independent deformation of the top and bottom of the sheet, according to the surface unevenness that exists between the pyrogenic electronic parts and radiators where the sheet is placed. Therefore, the thermally conductive composite sheets of the present invention offer a higher thermally conductivity than the conventional thermally conductive sheets, at least in part due to their good contact between electronic parts.

Further, the employment of such a porous reinforcing material has led to the manufacturing method of the thermally conductive composite sheets of the present invention by a simple process, wherein the porous reinforcing material layer is placed on, under, or within the liquid addition curing type organopolysiloxane composition layer, followed by the press-forming of the composition layer and the porous reinforcing material layer by applying pressure form the top and bottom under a heated condition.

The thermally conductive composite sheets of the present invention are superior in thermally conductivity and flexibility (to provide contact with the electronic parts and so on) and are suitable for mass production and for the assembly process of electronic instruments. Therefore, utilization of the thermally conductive composite sheets enables the effective production of electronic instruments wherein performance degradation caused by heat hardly occurs.

In the foregoing and in the following examples, all temperatures are set forth uncorrected in degrees Celsius; and, unless otherwise indicated, all parts and percentages are by weight.

The entire disclosure of all applications, patents and publications, cited above and below, and of corresponding Japanese Application No. 6-082450, filed Mar. 29, 1994, are hereby incorporated by reference.

EXAMPLES

In the next section, the present invention is illustrated with an example, however, the invention is not limited only to the following example. In the example, parts are indicated by weight parts and all the viscosity values were obtained at 25° C.

Example 1

One hundred (100) weight parts of a dimethyl polysiloxane, which contains 5 mol % of methyl vinyl siloxyl units and having terminals blocked with trimethyl siloxyl groups (viscosity: 4000 cSt) and 370 weight parts of aluminum oxide (Alumina AS-30, trade name, manufactured by Showa Denko, Ltd.) were kneaded at 150° C. for 2 hours. After the obtained kneaded product was cooled to room temperature, 0.3 weight parts of chloroplatinic acid complex with vinyl siloxane (platinum content of 1 weight %) and 0.015 weight parts of ethynyl cyclohexanol were added to the kneaded product and mixed until uniform. A liquid addition curing type organopolysiloxane composition was prepared by mixing 4.8 weight parts of methyl hydrogen polysiloxane, expressed by the following formula:

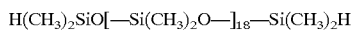

$H(CH_3)_2SiO[-Si(CH_3)_2O-]_{18}-Si(CH_3)_2H$ with said mixture until uniform.

Three hundred eighty g (380 g) of the organopolysiloxane composition was placed on a fluorine resin coated board (300 mm×300 mm) preheated to 150° C. Then twine woven polyester mesh cloth (300 mm×300 mm×0.2 mm in thickness) with a 1.5 mm air gap size was placed on top as a porous reinforcing material layer. Then the composition and the polyester mesh cloth were surrounded by a fluorine resin coated frame (inner frame size: 280 mm×280 mm×2 mm). Further, a fluorine resin coated board, the same as described above, was placed on the composition and the polyester mesh cloth to provide a laminate.

A silicone rubber sheet was obtained by press-forming the laminate obtained above, which comprised of the fluorine resin coated boards, the composition and the polyester mesh cloth, at 150° C. for 5 minutes.

The obtained silicone rubber sheet possesses the polyester mesh cloth layer incorporated therein at a depth of 0.5 to 0.8 mm from one surface, without exposing any parts of the mesh cloth to the surface. The hardness of this silicone rubber sheet was 27 by the Asker C hardness scale and the thermally conductivity was $3.3 \times 10^{-3}$ cal/cm·sec·° C. Hardness and thermally conductivity were measured by the following methods.

Measurement for the Asker C Hardness

Based on the SRIS 0101 (Standards of Japanese Rubber Industry Society) and JIS S 6050, the measurement employed a spring type hardness tester, the Asker C model (manufactured by Kohbunshi Keiki, K.K., a rubber and plastic hardness tester).

Measurement for Thermally Conductivity

Thermal conductivity was measured by using a thermal conductivity meter (trade name: Shotherm QTM Rapid Thermal Conductivity Meter, manufactured by Showa Denko, Ltd.), based on the non-steady state heat ray method.

Comparison Example 1

A glass cloth of 0.2 mm thickness and 0.1 mm of gap size was employed in place of the polyester mesh cloth in Example 1, and press-formed as similarly described in Example 1. One surface of the glass cloth was exposed and both surfaces were not covered completely with a silicone rubber layer.

Further, the surface at the glass cloth side was uneven, therefore its ability to provide contact during use is reduced. Thus, it is obvious that the ability to radiate heat is also reduced.

What is claimed is:

1. A thermally conductive composite sheet which comprises:
    a cured silicone rubber layer containing a thermally conductive filler and having an Asker C hardness of from 5 to 50 homogeneously throughout the layer; and
    a porous reinforcing material layer having pores of at least 0.3 mm in diameter, which is incorporated wholly within said silicone rubber layer
    wherein the silicone rubber layer is prepared from a liquid addition curing silicone rubber composition containing:
        (a) an organopolysiloxane having at least two alkenyl groups within the molecule;
        (b) an organohydrogen polysiloxane having at least two hydrogen atoms bound to silicon atoms within the molecule;
        (c) a platinum group metallic catalyst; and
        (d) a thermally conductive filler.

2. The thermally conductive composite sheet of claim 1, wherein the porous reinforcing material layer is a polyester mesh cloth or a glass cloth.

3. The thermally conductive composite sheet of claim 1, wherein the silicone rubber layer provides a continuous phase of cured silicone rubber above and below the porous reinforcing material through at least some of the pores of the porous reinforcing material.

4. The thermally conductive composite sheet of claim 1, wherein the thermally conductive filler is aluminum oxide, boron nitride, aluminum nitride, zinc oxide, silicon carbide, quartz, aluminum hydroxide or mixtures thereof.

5. The thermally conductive composite sheet of claim 1, wherein the silicone rubber layer contains 25% to 90% of weight of the thermally conductive filler, based on the total weight of the silicone rubber.

6. The thermally conductive composite sheet of claim 1, wherein the porous reinforcing layer has pores of 0.3 to 10 mm in diameter and a thickness of 0.1 to 1.0 mm.

7. The thermally conductive composite sheet of claim 1, containing two or more porous reinforcing material layers incorporated within the silicone rubber layer.

8. The thermally conductive composite sheet of claim 1, wherein in the liquid addition curing silicone rubber composition the organopolysiloxane, (a), is of the formula:

$R_aSiO_{(4-a)/2}$ wherein R is a halogen-substituted or unsubstituted monovalent hydrocarbon group, and the organohydrogen polysiloxane, (b), has 0.1 to 1.5 hydrogen atoms bound to silicon atoms per alkenyl group in the organopolysiloxane (a).

9. A thermally conductive composite sheet of claim 1, prepared by a process which comprises placing the porous reinforcing material layer on, under or within the liquid addition curing silicone rubber then press-forming said composition and porous reinforcing material layer by applying pressure from the top and bottom under a heated condition, to cure the silicone rubber and obtain a thermally conductive composite sheet having a porous reinforcing material layer incorporated wholly within a silicone rubber layer.

10. The thermally conductive composite sheet prepared by the process of claim 9, wherein a liquid silicone rubber composition is provided on a surface, the porous reinforcing material layer is laid over the composition and press forming is provided by applying pressure from above and below with a suitable frame supporting the sides.

11. The thermally conductive composite sheet prepared by the process of claim 9, wherein press forming is conducted at a temperature of 50° C. to 200° C. and a pressure of 5 to 50 kgf/cm$^2$.

* * * * *